(12) United States Patent
Shen et al.

(10) Patent No.: US 9,653,129 B2
(45) Date of Patent: May 16, 2017

(54) DRIVER STRUCTURE FOR CHIP-TO-CHIP COMMUNICATIONS

(71) Applicant: SK hynix memory solutions inc., San Jose, CA (US)

(72) Inventors: Chun-Ju Shen, Santa Clara, CA (US); Jenn-Gang Chern, Redwood City, CA (US); Zichuan Cheng, San Jose, CA (US); Huei-Ching You, San Jose, CA (US)

(73) Assignee: SK Hynix Memory Solutions Inc., San Jose, CA (US)

( * ) Notice: Subject to any disclaimer, the term of this patent is extended or adjusted under 35 U.S.C. 154(b) by 0 days.

(21) Appl. No.: 14/973,530

(22) Filed: Dec. 17, 2015

(65) Prior Publication Data

US 2016/0180897 A1    Jun. 23, 2016

Related U.S. Application Data

(60) Provisional application No. 62/093,371, filed on Dec. 17, 2014.

(51) Int. Cl.
*G11C 7/10* (2006.01)

(52) U.S. Cl.
CPC ............ *G11C 7/106* (2013.01); *G11C 7/1057* (2013.01)

(58) Field of Classification Search
None
See application file for complete search history.

(56) References Cited

U.S. PATENT DOCUMENTS

2003/0193351 A1    10/2003  Fukui
2007/0152749 A1*   7/2007  Liu .......................... H03K 5/01
                                                              330/129
2011/0248750 A1    10/2011  Seo et al.

* cited by examiner

*Primary Examiner* — James G Norman
(74) *Attorney, Agent, or Firm* — IP & T Group LLP

(57) ABSTRACT

Apparatus for chip-to-chip communications may include a first driving unit and a second driving unit. The first driving unit may receive input data, generate a first output data based on the input data, and output the first output data. The second driving unit may receive the input data, generate a second output data with a pre-emphasis peak and output the second output data. The second output data may be generated by delaying and inverting the input data, and have a predetermined weight.

18 Claims, 5 Drawing Sheets

DRIVER STRUCTURE FOR CHIP-TO-CHIP COMMUNICATIONS

CROSS-REFERENCE TO RELATED APPLICATIONS

This application claims the benefit of U.S. Provisional Application No. 62/093,371, filed Dec. 17, 2014, the entire contents of which are incorporated herein by reference.

BACKGROUND

1. Field

Exemplary embodiments of the present disclosure relate to chip-to-chip communications.

2. Description of the Related Art

Recently, load of memory systems s getting higher. For example, in chip-to-chip communications with Mbps toggle rate in the hundreds, a transmission line is not long enough (i.e., only a few inches) to cause any significant attenuation on signals. Therefore, the speed is mostly limited by the receiver's load. In some applications such as NAND flash storage, a driver of controller chip needs to drive multiple chips or multiple dies packed in the same chip. In either scenario, the total lumped load can easily go up to 20 to 30 pF or more. Due to heavier loads contributed by multi pie dies and higher speed requirements, there is a strong bottleneck in the chip-to-chip communications. Therefore, there is a need to provide a scheme to solve the bottling of the heavy load and the higher speed requirements in chip-to-chip communications.

SUMMARY

Embodiments of the present disclosure are directed to an apparatus and a system to compensate for the effect of heavy load and satisfy the higher speed requirement, in chip-to-chip communications.

In accordance with an embodiment of the present invent on an apparatus may include a first driving unit and a second driving unit. The first driving unit may receive input data, generate a first output data based on the input data, and output the first output data. The second driving unit may receive the input data, generate a second output data with a pre-emphasis peak and output the second output data. The second output data may be generated by delaying and inverting the input data and have a predetermined weight.

In accordance with another embodiment of the present invention, a system may include a transmitting chip, a receiving chip, and a transmission line coupled between the transmitting chip and the receiving chip. The transmitting chip may include a first driving unit and a second driving unit. The first driving unit may receive input data, generate a first output data based on the input data, and output the first output data. The second driving unit may receive the input data, generate a second output data with a pre-emphasis peak, and output the second output data. The second output data may be generated by delaying and inverting the input data, and have a predetermined weight.

DETAILED DESCRIPTION

Figure 1:
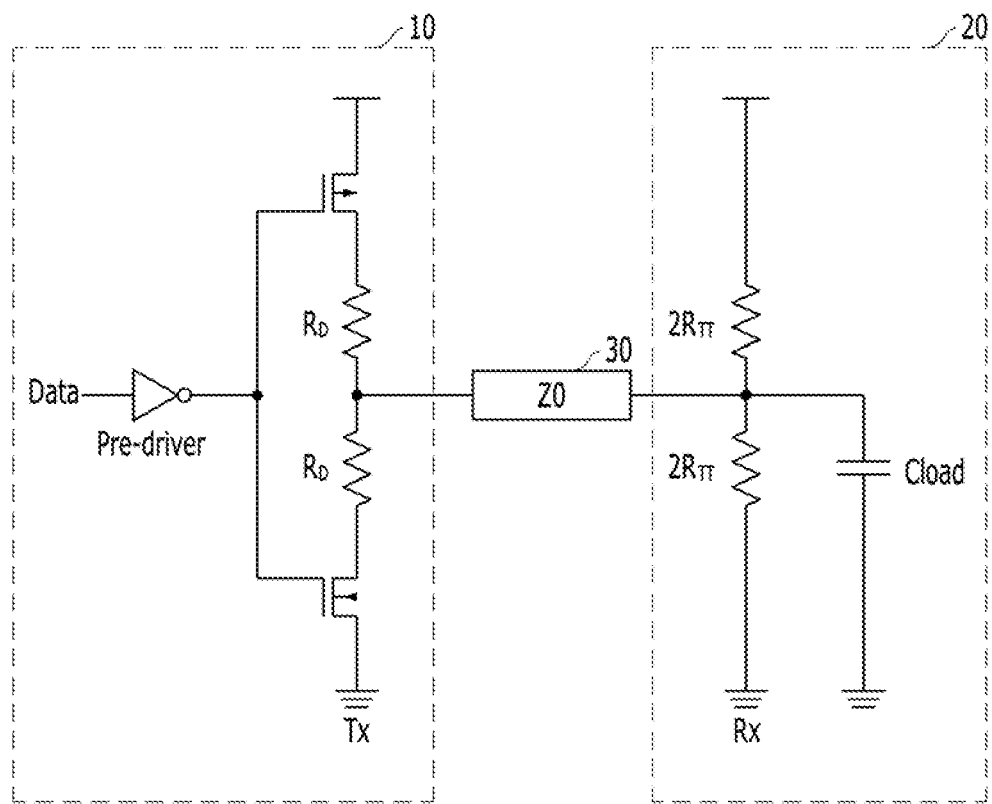
FIG. 1 illustrates a communication system including general driver.

Various embodiments will be described below in more detail with reference to the accompanying drawings. The present invention may, however, be embodied in different forms and should not be construed as limited to the embodiments set forth herein. Rather these embodiments are provided so that this disclosure will be thorough and complete, and will fully convey the scope of the present invention to those skilled in the art. Throughout the disclosure, like reference numerals refer to like parts throughout the various figures and embodiments of the present invention.

The invention may be implemented in numerous ways, including as a process, an apparatus; a system; a composition of matter; a computer program product embodied on a computer readable storage medium; and/or a processor, such as a processor configured to execute instructions stored on and/or provided by a to memory coupled to the processor. In this specification, these implementations, or any other form that the invention may take, may be referred to as techniques in general, the order of the steps of disclosed processes may be altered within the scope of the invention. Unless stated otherwise, a component such as processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

The input/output (I/O) toggle rate in chip-to-chip communications is limited by the RC time constant on a transmission path, where R is resistance and C is capacitance. As the capacitance C keeps increasing for more dies being packed together, the resistance R has to decrease to maintain the same RC time constant to achieve the target speed.

However, based on the transmission line theory, the driver impedance of the transmitter or receiver impedance has to match the transmission line (e.g., the PCB trace) impedance to prevent signals from bouncing back and forth between the trace ends and destroying the signal integrity (or signal quality). Since the trace impedance is industrially chosen to be 50 ohms, ideally R should also be tuned to 50 ohms to avoid reflections. If the receiver impedance or the driver impedance arbitrarily reduces, eventually the signal integrity will be killed by the reflections. In other words, the resistance R is not supposed to be design variable to cancel out the effect of the capacitance C. As both the capacitance C and the target speed increase, eventually the driver may not completely charge or discharge the load in one bit cycle, and inter-symbol interference (ISI) may occur.

As the demand of storage capacity in the chip-to-chip communications such as a NAND I/O system including a NAND flash storage grows, it is necessary to pack more dies into the same package while requiring the driver to toggle at an even higher rate. So far, the speed limit is almost reached due to the fundamental RC time-constant constraint. Therefore, it is necessary to explore other driver architectures to solve this fundamental issue.

In the high speed serial I/O applications, the multiple Gbps signal travels through a long communication channel. When the signal arrives at the receiver, its high frequency components are attenuated severely by the channel due to skin effect and dielectric losses, and channel equalization techniques are widely used to recover the signal by compensating the frequency response of the channel. The channel equalization may be done on both the driver side and the receiver side. On the receiver side, techniques called liner equalization and decision-feed-back (DFB) are often used. On the driver side, a technique called pre-emphasis is often used.

FIG. 1 illustrates a communication system including a general driver.

Referring to FIG. 1, the system includes a driver of a transmitter side 10, a receiver side 20, and a transmission line 30. The driver 10 may be a voltage-mode driver with its output to impedance calibrated to $R_D$. The transmission line 30 may be a (printed circuit board) PCB trace with impedance $Z_0$. The receiver side 20 includes a resistor termination with effective impedance $(2R_{TT})\|(2R_{TT})=R_{TT}$, and a receiver represented by a capacitor load $C_{load}$. Even though the voltage-mode driver is shown here for illustration, a current-mode driver may be applied.

Based on the transmission line theory, to avoid the reflection at the receiver-trace boundary, it is required that $R_{TT}=Z_0$. Furthermore, to avoid the reflection at the driver-trace boundary, it is required that $R_D=Z_0$. $Z_0$ may be chosen to be 50 ohms, which means in the reflection-less condition, $R_{TT}=50$ ohms and/or $R_D=50$ Ohms. At the receiver, the RC time constant is $(R_{TT}\|Z_0)C_{load}=25C_{load}$, which depends only on the capacitor load $C_{load}$ if the impedance matched condition is maintained. As the capacitor load $C_{load}$ increases, the RC time constant increases, and becomes the limiting factor for I/O to operate at a high speed.

One scheme to push the I/O operation to a higher speed may be to reduce the termination $R_{TT}$ for a smaller RC time constant. For this scheme, since termination is not matched to the trace, reflections that degrade the signal quality are expected. Smaller $R_{TT}$ reduces the signal swing and may only be recovered by reducing the driver impedance $R_D$ as well. This may further kill the impedance-matched condition at the driver-trace boundary, as well as cause more reflections and worse signal quality. Reducing the termination $R_{TT}$ also means the system burns more direct current (DC) power. If the general structure in FIG. 1 is used, the channel does not attenuate the signal, and the driver still fails to drive the heavy load on the receiver side. Thus, other driver architectures are required.

Figure 2:
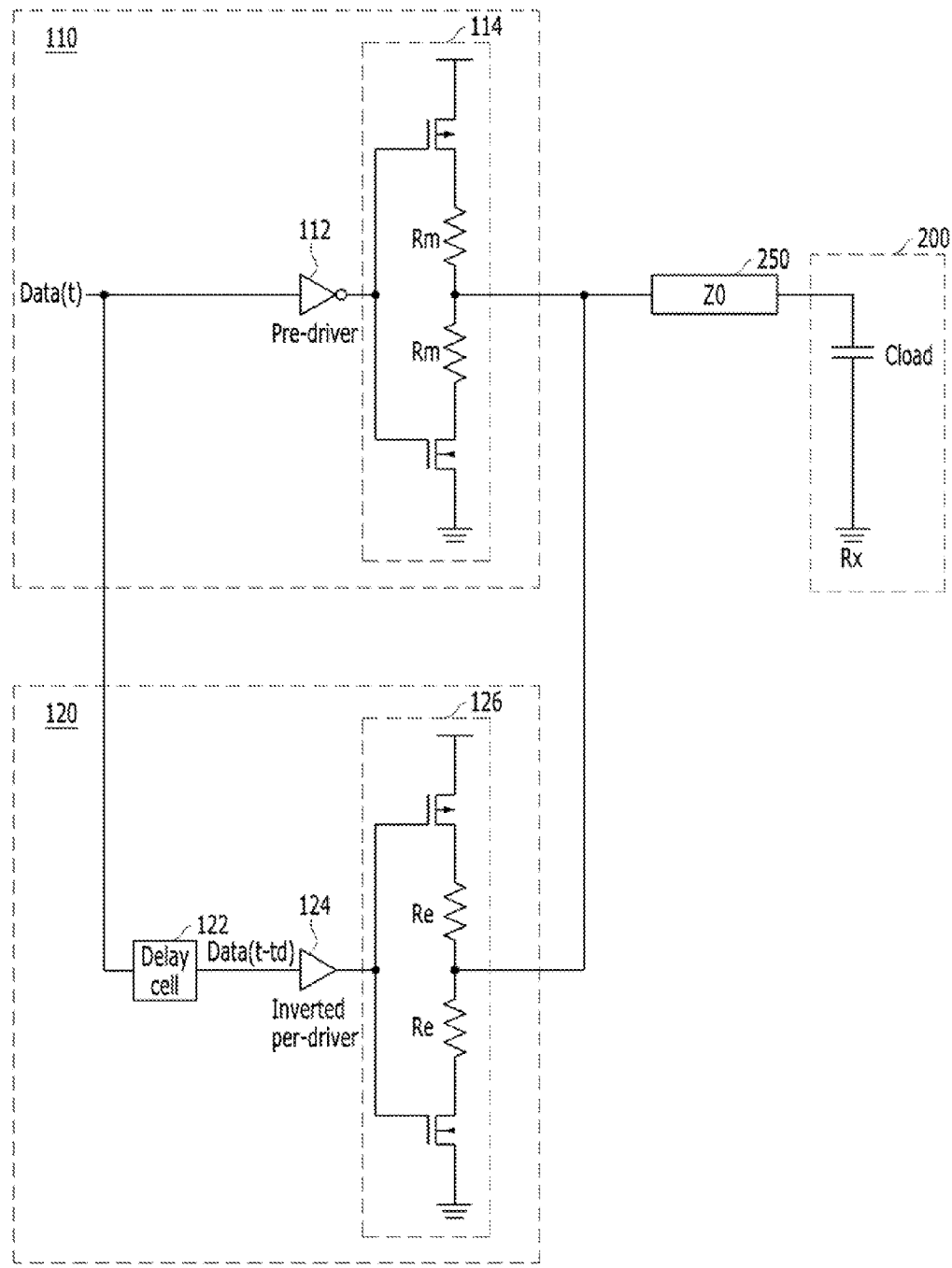
FIG. 2 illustrates a communication system including a driver in accordance with embodiments of the present invention.

In the embodiments of the present invention as a new driver architecture, as shown in FIG. 2, the pre-emphasis technique is used to compensate the effect of a heavy load in short-distance communications. The disclosed system demonstrates promising signal integrity while burning much lower power, compared to the system shown in FIG. 1. In some embodiments, the present invention is applied to a medium speed (i.e., hundreds of Mbps) I/O for short distance chip-to-chip communications. In the described architecture, the termination on the receiver side may be removed, because the driver impedance has been matched to the transmission line (i.e., the PCB trace) to absorb the reflections. The disclosed scheme may be especially useful for NAND flash I/O applications. Because a full rate clock may not be available in some applications such as double-data-rate (DDR) application, embodiments of the present invention consider a one-bit-delay cell fed by a half-rate clock.

FIG. 2 illustrates a communication system including a driver in accordance with embodiments of the present invention. For example, the communication system may be chip-to-chip communications system such as the NAND I/O system including the NAND flash storage.

Referring to FIG. 2, the communication system may include a transmitter, a receiver 200 and a transmission line 250. The transmitter and the receiver 200 may be integrated on different chips from each other. The transmitter may include a first driving unit 110 and a second driving unit 120.

The first driving unit 110 may receive input data, generate a first output data based on the input data, and output the first output data. The second driving unit 120 may receive the input data, generate a second output data with a pre-emphasis peak and output the second output data. In some embodiments, the second output data may be generated by delaying and inverting the input data. The second output data may have a predetermined weight such that the pre-emphasis peak of the second output data is smaller than peak of the first output data.

The first driving unit 110 may include a pre-driver 112 and a voltage driver 114. The pre-driver 112 may receive the input data Data(t), invert the input data Data(t) and output the inverted input data. The voltage driver 114 may include a pull-up device (i.e., a transistor) coupled to a voltage supply terminal, a pull-down device (i.e., a transistor) coupled to a ground terminal, and two registers in series, each having a resistance $R_m$. The voltage driver 114 may receive the inverted input data from the pre-driver 112, and toggle to the inverted input data to output the first output data to the transmission line 250.

The second driving unit 120 may include a delay cell 122, a pre-driver 124 and a voltage driver 126. The delay cell 122 may receive and delay the input data Data(t), and output the delayed input data Data(t–td). The pre-driver 124 may receive the delayed input data Data(t–td), and output the delayed input data Data(t–td). The voltage driver 126 may include a pull-up device (i.e., a transistor) coupled to the voltage supply terminal, a pull-down device (i.e., a transistor) coupled to the ground terminal, and two registers in series, each having a resistance $R_e$. The voltage driver 126 may receive the delayed input data Data(t–td) from the pre-driver 124, and toggle the delayed input data Data(t–td) to output the second output data to the transmission line 250.

As shown in FIG. 2, the I/O system may include two drivers: one is the main driver unit (or the main transmitting (Tx) unit) 110, and the other is the pre-emphasis driver unit (or pre-emphasis Tx unit) 120 for sending delayed, inverted and weighted data. In some embodiments, the inversion of data may be done at the pre-driver stage 120, such that the data transmitted on the main path through the main driver unit 110 and the pre-emphasis path through the pre-emphasis driver unit 120 have opposite polarities. Alternatively, the inversion of data may be done at one of many stages along the data path.

The delay cell 122 may delay the input Data(t) and send the output Data(t–$t_d$) at $t_d$ seconds later. The basic principle of pre-emphasis is to delay the data, invert its polarity, and then add it back to the original data with a proper weight. The originally uncompleted charge or discharge may be compensated by the pre-emphasis and thus the inter-symbol interference (ISI) is eliminated. Furthermore, the system does net require the termination (i.e., $R_{TT}=\infty$), and therefore the DC power saved by two times when the same signal swing is specified.

Figure 3:
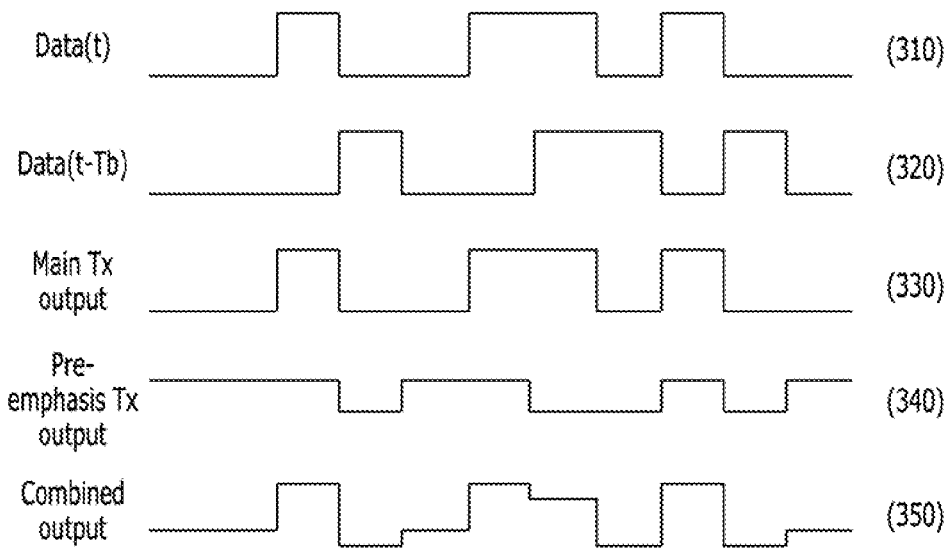
FIG. 3 is a timing diagram illustrating waveforms of driver in accordance with embodiments of the present invention.

FIG. 3 is a timing diagram illustrating waveforms of a driver in accordance with embodiments of the present invention. For example, the driver of FIG. 3 may be the driving units 110 and 120 of FIG. 2. For simplicity, it is assumed that the delay time $t_d$ is one-bit-delay $T_b$.

Referring to FIG. 3, the reference numeral 310 represents the input data Data(t). The reference numeral 320 represents the delayed input data Data(t−td) by the delay cell 122. The reference numeral 330 represents the output of the main driving unit or driver 110. The reference numeral 340 represents the output of the pre-emphasis driving unit or driver 120. The reference numeral 350 represents combined outputs of the output of the main driving unit or driver 110 and the output of the pre-emphasis driving unit or driver 120.

The output of the pre-emphasis driver 120 in FIG. 2 is a delayed, inverted, and weighted version of the output of the main driver 110. When the effects of both the main driver 110 and the pre-emphasis driver 120 are combined, the final waveform 350 contains peaks right after the data transitions, and the signal stays at certain DC high level or low level when data does not toggle. The peak reallocates more energy to the data transition, and makes it possible to completely charge the load to the steady state and avoid the ISI. In the z-domain, the output may be represented by the transfer function $(1-wz^{-1})$ where w is the weight of the pre-emphasis driver 120. The transfer function shows that the pre-emphasis driver 120 is a high pass filter, and therefore it may compensate the low-pass filtering effect from the receiver load 200 of FIG. 2.

In some embodiments, the height of the pre-emphasis peak and the DC swing are controlled by the ratio $R_e/R_m$, where $R_m$ is the impedance of the main driver 110 and $R_e$ is the impedance of the pre-emphasis driver 120. Note that the effective driver impedance $R_m \| R_e$ should be matched to the trace impedance (i.e., impedance of the transmission line 250) $Z_0$. With this source terminated scheme, the termination at the receiver 200 is not needed and the power consumption is dramatically reduced.

In some embodiments, the width of the peak of the pre-emphasis driver 120 is controlled by the delay $t_d$ of the delay cell 122. Both the height and the width of the peak may be used to adjust the pre-emphasis strength.

There are several structures for implementing the delay cell 122, including a programmable delay chain, a phase interpolator, and a pure digital circuit. In some embodiments, the pure digital circuit may be used for the delay cell 122. In some applications using double-data-rate (DDR), since only a half-rate clock (e.g., its pulse width is the same as the data's) is available, it is desirable for the delay cell 122 to generate the one-bit-delay with only the half-rate clock.

Figure 4:
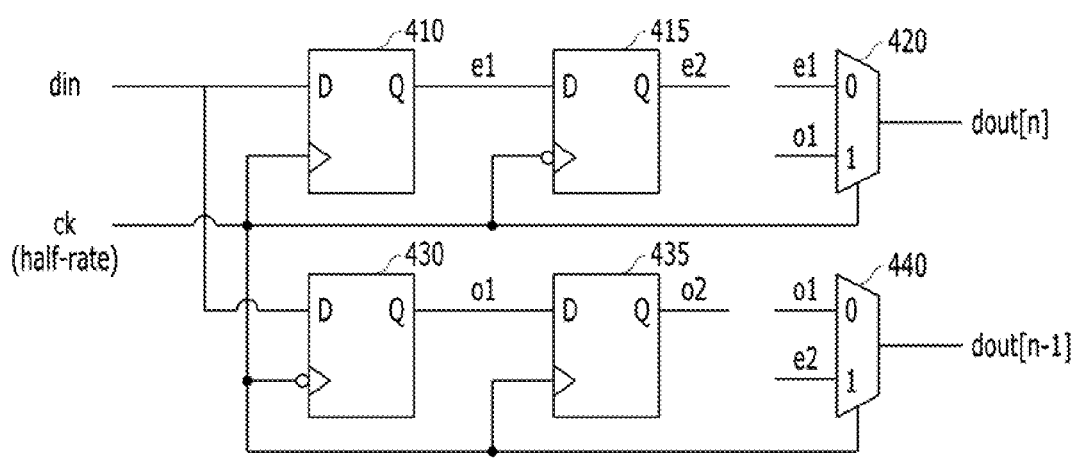
FIG. 4 is a diagram illustrating a delay cell in accordance with embodiments of the present invention.

FIG. 4 is a diagram illustrating a delay cell 400 in accordance with embodiments of the present invention. For example, the delay cell 400 of FIG. 4 may be the delay cell 122 of FIG. 2.

Referring to FIG. 4, the delay cell 400 may include a first flip-flop 410, a second flip-flop 415, a third flip-flop 430, a fourth flip-flop 435, a first selector 420, and a second selector 440. The delay cell 400 may receive and delay the input data din based on a clock ck. The input data din corresponds to the data Data(t) of FIG. 2. The clock ck has a pulse width substantially identical to that of the input data din. The clock ck maybe a half-rate clock of a double data rate (DDR) memory system.

The first flip-flop 410 may receive the input data din and outputting a first data e1 based on the clock ck. The second flip-flop 415 may receive the first data e1 and output, second data e2 based on an inversion of the clock ck. The third flip-flop 430 may receive the input data din and output a third data o1 based on the inversion of the clock ck. The fourth flip-flop 435 may receive the third data o1 and output a fourth data o2 based on the clock ck.

The first selector 420 may receive the first data e1 and the third data o1 and output, as output data dout[n], one of the first data e1 and the third data o1 based on the clock ck. The second selector 440 may receive the second data e2 and the fourth data o2 and output, as output data dout[n−1], one of the second data e2 and the fourth data o2 based on the clock ck.

As shown in FIG. 4, the delay cell 400 takes the data din and a half-rate clock ck, and generates two data outputs, dout[n] and dout[n−1], with their timing shifted by one-bit delay.

Figure 5:
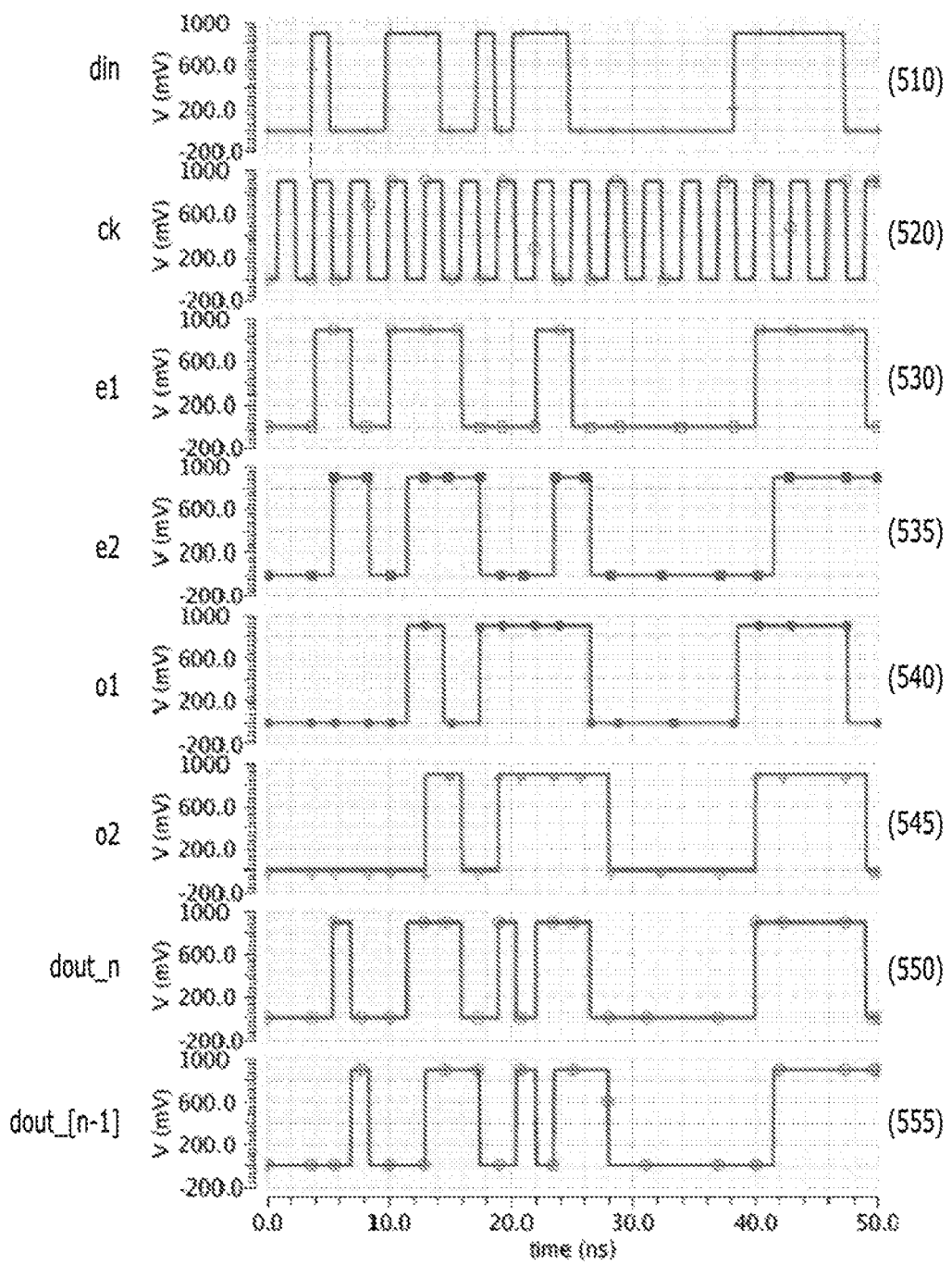
FIG. 5 is a timing diagram illustrating waveforms of a delay cell in accordance with embodiments of the present invention.

FIG. 5 is a timing diagram illustrating waveforms of a delay to cell in accordance with embodiments of the present invention. For example, waveforms of FIG. 5 may be waveforms of the delay cell 400 of FIG. 4.

Referring to FIG. 5, reference numerals 510 and 520 represent input data and a clock of the delay cell 400, respectively. Reference numeral 530 represents output data e1 of the flip-flop 410. Reference numeral 535 represents output data e2 of the flip-flop 415. Reference numeral 540 represents output data o1 of the flip-flop 430. Reference numeral 545 represents output data o2 of the flip-flop 435. Reference numeral 550 represents output data dout[n] of the selector 420. Reference numeral 555 represents output data dout[n−1] of the selector 440.

As shown in FIG. 5, din 510 is random data with the same pulse width as a clock ck 520. The output data data[n] 550 and dout[n−1] 555 are delayed replicas of the input data din 510. The difference between dout[n] and dout[n−1] is that dout[n−1] is delayed by a bit duration $T_b$. The internal signals e1, e2, o1, and o2 are also shown on the waveforms for better understandings of the mechanism.

Figure 6:
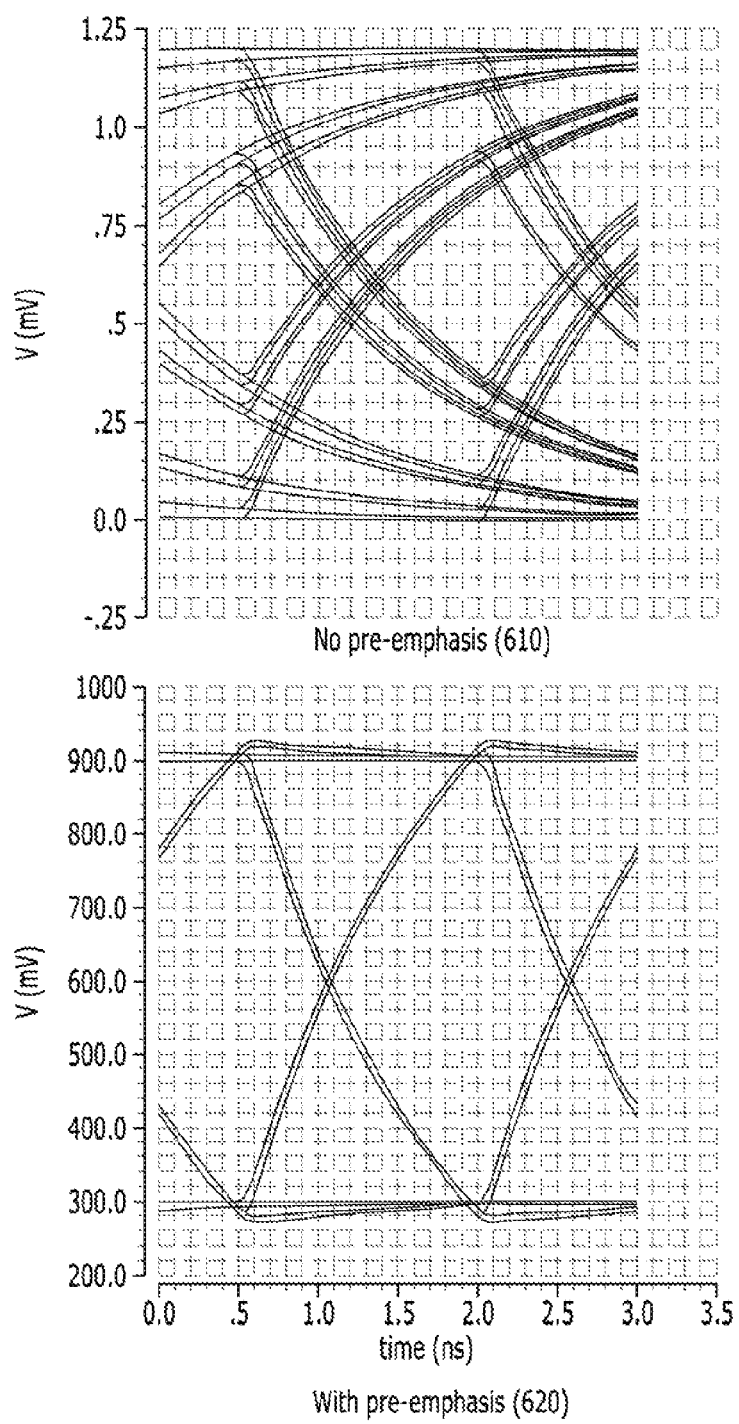
FIG. 6 are eye diagrams of a driver without and with pre-emphasis in accordance with embodiments of the present invention.

FIG. 6 are eye diagrams of a driver without and with pre-emphasis in accordance with embodiments of the present invention.

In FIG. 6, the eye diagrams are metrics to show the signal integrity or signal quality. The I/O in the upper diagram 610 has no pre-emphasis applied, and its driver impedance is tuned to 50 ohms to match the trace. The lower diagram 620 has pre-emphasis enabled, the impedance of the main driver 110 in FIG. 2 tuned to 67 ohms, and the impedance of the pre-emphasis driver 120 in FIG. 2 tuned to 200 ohms. The effective impedance of the combined main driver 110 and pre-emphasis driver 120 is 67∥200=50 ohms to match the trace (i.e., the transmission line 250 in FIG. 2). In the both cases, the load of the receiver 200 in FIG. 2 is 25 pF, no termination is used, and the trace 250 is loss-less with 500 ps propagation delay. The I/O toggle frequency is set to 333 MHz in the simulation.

As can be seen, without the pre-emphasis (610), the driver is unable to completely charge the load to the steady state within a bit period. The resulting eye diagram 610 shows severe ISI. By to enabling the pre-emphasis driver 120, it is possible to reshape the frequency response of the signals, allocate more energy to the transitions, and reduce the DC swing. Although the DC swing is less, the overall eye is much cleaner and has much less ISI. In addition, there is no reflection shown on the eye diagrams, because the effective impedance of the drivers 110 and 120 matches the impedance of the transmission line 250. From the comparison, it can be seen how pre-emphasis helps the driver drive a heavy load when the basic RC time constant is too large for the driver to complete the charge or discharge within the available time at a certain target speed.

Also, the DC power is compared, which consumed by between the proposed system in FIG. 2 and the system in FIG. 1 that uses resistor terminations to improve the ISI. For a fair comparison, the DC swing, related to the eye height, is adjusted to be substantially identical in both systems. In the system in FIG. 1, to match the trace impedance, $R_{TT}=R_D=50$, and the DC current is $$\frac{VDD}{(50||100)+100} = \frac{VDD}{133}.$$

In contrast, in the disclosed system in FIG. 2, to match the DC swing, the main driver 110 is calibrated to 67 ohms, and the pre-emphasis driver 120 is calibrated to 200 ohms. In this condition, the consumed DC current is $$\frac{VDD}{200+67} = \frac{VDD}{267}.$$

Therefore, by this simple comparison it can be seen that the disclosed system in FIG. 2 consumes only 50% power of the system in FIG. 1.

As described above, the system in FIG. 2 provides benefits in terms of the DC swung and the DC power consumption, compared to the system in FIG. 1. Embodiments of the systems may be modified and extended as follows:

The system shown in FIG. 2 only utilizes one post-tap for pre-emphasis. That is, the driver's output only depends on the current data and the previous data delayed by one bit. However, the idea of using pre-emphasis to compensate the heavy load is not limited to one tap system, and may be extended to multi-tap system, where the driver's output may depend on the present data, and data before and after the present data. How to design the multi-tap pre-emphasis may depend on the need of the applications.

The system shown in FIG. 2 uses a voltage-mode driver with pull-up and pull-down devices to toggle the data. The idea of using pre-emphasis to drive the heavy load may also be extended to the current-mode driver, which sends out differential signals to represent the data. Voltage-mode drivers usually consume less power while current-mode drivers provide better performance.

While the present invention has been particularly shown and described with reference to exemplary embodiments thereof, it will be understood by those of ordinary skill in the art that various the spirit and scope of the present invention as defined by the following claims. Thus, the foregoing is by way of example only and is not intended to be limiting. For example, any numbers of elements illustrated and described herein are by way of example only. The present invention is limited only as defined in the following claims and equivalents thereof.

What is claimed is:

1. An apparatus comprising:
    a first driving unit suitable for receiving input data, generating a first output data based on the input data, and outputting the first output data; and
    a second driving unit suitable for receiving the input data, generating a second output data with a pre-emphasis peak, and outputting the second output data, wherein the second driving unit includes a delay cell suitable for delaying the input data, a second pre-driver suitable for receiving the delayed input data and outputting the delayed input data, and a second voltage driver with pull-up and pull-down devices suitable for toggling the delayed input data, and outputting the second output data,
    wherein the second output data is generated by delaying and inverting the input data, and wherein the second output data has a predetermined weight.

2. The apparatus of claim 1, wherein the predetermined weight is determined such that a peak of the first output data is greater than the pre-emphasis peak of the second output data.

3. The apparatus of claim 1, wherein the first driving unit comprises:
    a first pre-driver suitable for receiving the input data, inverting the input data, and outputting the inverted input data; and
    a first voltage driver with pull-up and pull-down devices, the first voltage driver suitable for receiving the inverted input data from the pre-driver, and toggling the inverted input data to output the first output data.

4. The apparatus of claim 1, wherein the pre-emphasis peak is determined based on impedances of the first voltage driver and the second voltage driver.

5. The apparatus of claim 1, wherein a width of the pre-emphasis peak is determined based on a delay value of the delay cell.

6. The apparatus of claim 1, wherein an effective impedance of the first voltage driver and the second voltage driver is matched to an impedance of a transmission line.

7. The apparatus of claim 1, wherein the delay cell receives and delays the input data based on a clock with a pulse width substantially identical to that of the input data.

8. The apparatus of claim 7, wherein the clock includes a half-rate clock of a double data rate (DDR) memory system.

9. The apparatus of claim 7, wherein the delay cell comprises:
    a first flip-flop suitable for receiving the input data and outputting a first data based on the clock;
    a second flip-flop suitable for receiving the first data and outputting a second data based on an inversion of the clock;
    a third flip-flop suitable for receiving the input data and outputting a third data based on the inversion of the clock;
    a fourth flip-flop suitable for receiving the third data and outputting a fourth data based on the clock;
    a first selector suitable for receiving the first data and the third data and outputting one of the first data and the third data based on the clock; and
    a second selector suitable for receiving the second data and the fourth data and outputting one of the second data and the fourth data based on the clock.

10. A system comprising:
    a transmitting chip;
    a receiving chip; and a transmission line coupled between the transmitting chip and the receiving chip, wherein the transmitting chip comprises:

a first driving unit suitable for receiving input data, generating a first output data based on the input data, and outputting the first output data to the transmission line; and a second driving unit suitable for receiving the input data, generating a second output data with pre-emphasis peak, and outputting the second output data to the transmission line, wherein the second driving unit includes a delay cell suitable for delaying the input data, a second pre-driver suitable for receiving the delayed input data and outputting the delayed input data, and a second voltage driver with pull-up and pull-down devices suitable for toggling the delayed input data, and outputting the second output data, wherein the second output data is generated by delaying and inverting the input data, and wherein the second output data has a predetermined weight.

11. The system of claim 10, wherein the predetermined weight is determined such that a peak of the first output data is greater than the pre-emphasis peak of the second output data.

12. The system of claim 10, wherein the first driving unit comprises:

a first pre-driver suitable for receiving the input data, inverting the input data, and outputting the inverted input data; and a first voltage driver with pull-up and pull-down devices, the first voltage driver suitable for receiving the inverted input data from the pre-driver, and toggling the inverted input data to output the first output data.

13. The system of claim 10, wherein the pre-emphasis peak is determined based on impedances of the first voltage driver and the second voltage driver.

14. The system of claim 10, wherein a width of the pre-emphasis peak is determined based on a delay value of the delay cell.

15. The system of claim 10, wherein an effective impedance of the first voltage driver and the second voltage driver is matched to an impedance of a transmission line.

16. The system of claim 10, wherein the delay cell receives and delays the input data based on a clock with a pulse width substantially identical to that of the input data.

17. The system of claim 16, wherein the clock includes a half-rate clock of a double data rate (DDR) memory system.

18. The system of claim 16, wherein the delay cell comprises:

a first flip-flop suitable for receiving the input data and outputting a first data based on the clock;

a second flip-flop suitable for receiving the first data and outputting a second data based on an inversion of the clock;

a third flip-flop suitable for receiving the input data and outputting a third data based on the inversion of the clock;

a fourth flip-flop suitable for receiving the third data and outputting a fourth data based on the clock;

a first selector suitable for receiving the first data and the third data and outputting one of the first data and the third data based on the clock; and a second selector suitable for receiving the second data and the fourth data and outputting one of the second data and the fourth data based on the clock.

* * * * *